VARIABLE THRESHOLD INSULATED GATE FIELD EFFECT DEVICE

Filed Oct. 3, 1966

INVENTOR.

EDWARD H. SNOW

BY Norman M. Kuntz

Roger S. Borovoy

ATTORNEYS

United States Patent Office 3,428,875
Patented Feb. 18, 1969

3,428,875

VARIABLE THRESHOLD INSULATED GATE FIELD EFFECT DEVICE

Edward H. Snow, Mountain View, Calif., assignor to Fairchild Camera and Instrument Corporation, Syosset, N.Y., a corporation of Delaware Filed Oct. 3, 1966, Ser. No. 583,896
U.S. Cl. 317—235 10 Claims
Int. Cl. H01l *11/14*

ABSTRACT OF THE DISCLOSURE

The threshold voltage of a MOS capacitor or transistor is precisely varied by placing two layers of nonferroelectric dielectric material between the body of semiconductor material and the gate electrode—the outer layer having a higher thermally activated conductivity than the inner layer—and then heating the resulting structure in the presence of a selected bias voltage. This produces a substantially permanent space charge at the interface between the two dielectric layers which in turn controls the threshold voltage of the MOS device.

This invention relates to semiconductor devices of the insulated gate field effect type, i.e., metal-dielectric-semiconductor devices such as capacitors and transistors, which, when the dielectric is an oxide, are commonly referred to as MOS devices. More particularly, this invention relates to an insulated gate field effect device having two layers of different dielectric materials for the gate insulation whereby the gate voltage required to produce an inversion layer in the semiconductor material may be adjusted to a predetermined desired value.

The basic structure and theory of metal-dielectric-semiconductor capacitors and transistors are well-known in the semiconductor art. For example, the theory of the operation of MOS capacitors may be found in an article by A. S. Grove, B. E. Deal, E. H. Snow, and C. T. Sah in Solid State Electronics, volume VIII, page 145 (1965), while that of the MOS transistor may be found in U.S. Patent No. 3,102,230 issued to Dawson Kahng on Aug. 22, 1963. Although a complete description of the theory of insulated gate field effect devices would be superfluous at this time, a brief description of the essential features of the operation of the devices is believed necessary to an understanding of this invention. In the following description of the invention and the theory thereof, the insulated gate field effect devices are often referred to as MOS devices. It is to be understood that the use of this term is for convenience only and is not meant to be restrictive. That is, the gate insulating layer may be formed from a material other than an oxide, e.g., silicon nitride.

An insulated gate field effect capacitor consists essentially of a body of semiconductor material having an ohmic electrical contact thereto, a layer of insulating material, such as silicon dioxide, on a surface thereof, and a metal electrode overlying the layer of dielectric. In such a device, the application of a voltage to the metal electrode, commonly referred to as the gate electrode, of proper magnitude and polarity will result in depleting the surface of the semiconductor material of majority carriers. Further increase of the potential over a relatively small voltage range will cause the depleted region to increase in depth until a maximum depth is attained. In the voltage range wherein the depletion region is changing in depth, the capacitance of the device changes from a maximum value corresponding to the capacitance of the dielectric alone to a minimum value corresponding to the capacitance of the dielectric in series with the semiconductor depletion layer. In other words, an MOS capacitor functions as a variable capacitor whose capacitance is a function of the applied voltage.

The insulated gate type of field effect transistor, commonly referred to as a MOST, employs a body or substrate of semiconductor material, usually monocrystalline, of one conductivity type having formed therein closely spaced source and drain regions of the opposite conductivity type which form P-N junctions with the substrate. A metal gate electrode which is separated from the semiconductor body by means of an insulating layer is disposed over the region between the source and the drain. In the normally off, or enhancement type MOST, the application of a potential between the gate and substrate of proper magnitude and polarity will first cause a depletion region to be formed under the gate electrode and finally result in the inversion of the surface of the semiconductor directly below the gate. This inverted layer forms a conductive path between the source and the drain regions with the conductivity of the path being a function of the magnitude of the applied potential due to the fact that increased potential attracts additional charge carriers to the vicinity of the conducting channel. Similarly, in a normally on or depletion type MOST, where the surface channel is normally preformed between the source and the drain regions, the application of a potential to the gate electrode of proper magnitude and polarity will deplete the source to drain region of charge carriers, resulting in a reduction of the conductivity of the surface channel.

In the use of MOS devices, it is often desirable that the threshold voltage of the device, i.e., the voltage at which the capacitance of the MOS capacitor begins to vary or the voltage at which the inversion layer in a MOST begins to form, be variable so that it can be accurately preset at a desired value. However, in the normal method of manufacturing MOS devices, the threshold voltage is determined by the thickness of the dielectric material under the gate electrode and the charge at the semiconductor-dielectric interface or in the dielectric material. Accordingly, these two parameters, particularly the oxide thickness, are varied in order to produce the desired threshold voltage. Since with this type of scheme, a different thickness or dielectric charge would have to be used for each threshold value, it obviously is not practical to build devices with all values of desired threshold voltages by the conventional method. Moreover, the desired value of threshold voltage cannot always be repeatably attained. It is therefore the common practice in the industry to produce all the devices with a threshold value in a predetermined standard range and then to bias the gate electrode in the particular circuit in which the device is used to attain a desired operating point other than that inherent in the device. Often, however, due to space limitations in the circuits and the undesirability of having many voltage sources present in the circuit, the use of individual bias sources for the MOS devices is objectionable. Accordingly, it would be quite desirable if it were possible to effectively build a bias source into each of the MOS devices so that the threshold voltage of each MOS could be individually set or varied as desired. Such a device, however must be reasonably stable at the operating temperatures and voltages for the device, i.e., the preset threshold voltage value must not appreciably change with the magnitude or polarity of the applied voltage.

Attempts which have previously been made to provide a field effect device having an effective built-in variable bias source are shown in U.S. Patents 2,791,760 and 2,791,761 issued May 7, 1957 to I. M. Ross and J. A. Morton respectively. In both of these attempts a ferroelectric dielectric material is placed between the semiconductor material and the gate electrode. Such crystalline dielectric materials exhibit the property of remaining polarized even in the absence of an applied gate voltage. Since such a dielectric material also exhibits electrostatic hysteresis, and hence has two stable and fixed polarization states, the resultant device is essentially a bistable switch or memory having two distinct threshold values which are essentially fixed by the nature of the ferroelectric material. Accordingly, although two different threshold values are present, the values cannot be set at any desired value to vary the operating point of the device. Moreover, since the polarization of the ferroelectric material can be changed by an input signal and since the material is stable in each of its polarization states, the mere removal of the input signal will not necessarily return the device to its preset state, i.e., the state prior to the application of the input signal to the gate, as is desired for many circuit applications.

An MOS device according to the invention which effectively has a built-in bias source whereby the threshold voltage value of the device may be set at any predetermined desired value and at any time briefly comprises a body of semiconductor material of a first conductivity type having a means for making ohmic contact thereto; a first layer of a first substantially insulating, nonferroelectric dielectric material on one surface of the body; a second layer of a second nonferroelectric dielectric material having a higher thermally activated conductivity than the first material formed on the exposed surface of the first dielectric layer; and a metal electrode overlying the exposed surface of the second dielectric layer. Thermally activated conductivity, as used herein, means a conductivity which increases with increased temperature.

The structure briefly described above is that of an MOS capacitor. The MOS transistor structure, according to the invention, is basically similar with the additional limitations that the body of semiconductor material contains two spaced regions of opposite conductivity type which form P-N junctions with the body, and that the double layer of dielectric material and the metal electrode overlies the region between the two P-N junctions.

With a double layer dielectric of the type briefly described above, the application of voltage $V_P$ to the gate electrode will cause an interfacial polarization or space charge to build up between the two dielectric layers. This polarization will cause the characteristics of the device to shift along the voltage axis by an amount $$\Delta V=\frac{K_o X_g}{K_g X_o}V_P$$

where $K_o$ and $X_o$ are the dielectric constant and thickness, respectively, of the inner layer and $K_g$ and $X_g$ are the dielectric constant and thickness, respectively, of the outer layer of dielectric. The time required for the build-up of the interfacial polarization is related to the ionic conductivity of the outer dielectric layer and hence is strongly temperature dependent. Accordingly, the threshold voltage of the device can be set at any predetermined desired value by employing the method of the invention as follows: heating the device to a desired elevated temperature; applying a suitable polarizing voltage across the dielectric layers for a period of time sufficient to produce the desired space charge polarization at the dielectric layer interface; cooling the device to a temperature at which the charges are immobilized or effectively "frozen in" the device; and then removing the polarizing voltage. The device can then be operated at the lower temperature with the threshold voltage remaining relatively stable at the new value even after the polarizing voltage is removed.

The invention and its adavntages will be more clearly understood from the following detailed description of the invention taken in conjunction with the accompanying drawings, wherein.

Figure 1:
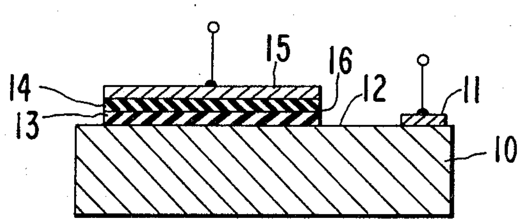
FIG. 1 is a cross sectional elevation view of a MOS capacitor according to the invention.

Referring now to FIG. 1 there is shown a body 10 of preferably monocrystalline semiconductor material such as silicon having an ohmic contact 11 affixed thereto. Although as shown the contact 11 is made to the upper surface 12 of the body 10, it is to be understood that the contact may be made to any exposed surface thereof. The conductivity type or resistivity of the semiconductor substrate or body is not critical, but the resistivity should be sufficiently high so as to provide a sufficient capacitance change with gate voltage. For example, P- or N-type silicon having a resistivity of about 10 ohm-centimeter may be used. Formed on the surface 12 of the semiconductor body 10 is a layer 13 of a nonferroelectric insulating dielectric material preferably having a very low conductivity and one which will form a stable interface with the semiconductor material. In the case of a silicon body 10, the dielectric layer 13 is preferably a layer of an oxide of silicon, e.g., silicon dioxide, which has been thermally grown on the surface 12 by heating the body 10 at an elevated temperature (about 900–1200° centigrade) in dry oxygen or water vapor for a period of time sufficient to produce the desired thickness of the oxide.

Formed on the exposed surface of the layer 13 is another layer of an insulating dielectric material (also nonferroelectric) but having a higher thermally activated or ionic conductivity than the layer of dielectric material 13. An example of a suitable dielectric layer 14 is a glass such as a lead borosilicate glass having a composition by weight of 75% PbO, 12% $SiO_2$, 10% $B_2O_3$, and 3% $TiO_2$. The dielectric 14 may be formed in any desired manner on the surface of the layer 13. For example, a lead borosilicate glass may be formed into layer 14 by depositing a fine powder of the above described glass on the surface of the layer 13 by a sedimentation process in a centrifuge and then fusing the glass powder at a temperature between 530 and 550° centigrade. The gate electrode 15 of the device is formed on the exposed surface of the dielectric layer 14 by any well-known techniques such as vacuum deposition or evaporation techniques. The gate may be any of the well-known metal contacting elements such as aluminum, chromium, etc.

In order now to understand the functioning of the device and the method of studying its threshold voltage value, a brief description of the phenomena which occur in the device upon the application of an electric fluid is believed necessary. A more detailed description of the occurring phenomena may be found in an article entitled Space Charge Polarization in Glass Films by E. H. Snow and M. E. Dumesnil, Journal of Applied Physics, volume 37, pages 2123–2131, April 1966.

Whenever a voltage is applied across an insulator, a gradually decaying absorption or polarization current is observed to flow. This current is in addition to any steady state leakage currents that may be present. In quartz and silicate glasses it is known that the polarization current is largely due to the motion of the mobile cations. These ions are not easily supplied and discharged at the electrodes of the device and accordingly, space charges are formed which account for the major voltage drop for the applied voltage. The field in the bulk of the sample of dielectric material is therefore reduced, causing the observed decay in the current. With the structure shown in FIG. 1, the application of a negative voltage to the gate electrode 15 causes the mobile positive ions in the layer 14 to slowly drift toward the gate electrode where they discharge or pile up leaving behind a negative space charge at the glass-oxide interface 16. The ions in the capacitor will continue to drift causing the space charge to continue to grow until the field in the bulk of the glass is reduced to zero. If now the sample is cooled to a temperature low enough to immobilize the ions, the resulting space charge will be "frozen in." The result is that the negative space charge built up at the interface 16 of the two dielectric layers will induce part of its image in the semiconductor material. Since the charge induced in the semiconductor material by the space charge will be in addition to any charge induced in the semiconductor by a voltage applied to the gate, this excess charge causes the capacitance-voltage characteristic to shift along the voltage axis according to the mathematical relationship expressed above. The shift along the voltage axis was found to be in a positive direction for a negatively applied bias and to be in a negative direction for a positively applied bias.

Since the production of the space charge at the dielectric interface is caused by the motion of ions, and since it is well-known that the motion of ions is temperature dependent, it is obvious that the time required to produce a given space charge at the dielectric interface with a given applied voltage is highly temperature dependent. Accordingly, although it is possible to build up the desired space charge by applying a given voltage for a prolonged period of time, for example, in the order of days or weeks, preferably the space charge is produced by heating the device to an elevated temperature, and then applying the voltage for a short period of time (of the order of minutes or less). Since the maximum space charge which can be produced at the interface is dependent solely upon the applied voltage, the time utilized for the application of voltage need only be sufficient to produce this level of space charge. The device is then cooled to a temperature to substantially immobilize the ions with the voltage still applied. The maintenance of the polarizing potential on the gate electrode during the cooling period is very important if an accurately set threshold value is desired. If the potential is removed while the device is still at an elevated temperature, the ions will tend to drift back to their original locations and thereby reduce the value of the space charge at the interface 16.

The particular temperature at which the ions are immobilized depends on the particular materials used for the dielectrics. If the ions are totally immobilized, the space charge should remain indefinitely. However, at temperatures wherein the ions are not completely immobilized, the space charge will tend to decay and thereby change the threshold value. For example, with the lead borosilicate glass and $SiO_2$ combination indicated above, the time constant for stability at room temperature is approximately one week. However, the time constant can be greatly increased by refrigerating to maintain the temperature of the device below room temperature. Accordingly, if it is desired to maintain a particular threshold value on the device for a period greater than the time constant of the device at its particular operating temperature, re-polarization of the device from time to time may be necessary. Preferably, however, the device is operated at a sufficiently low temperature so that the time constant is long enough and re-polarization will not be necessary.

Figure 2:
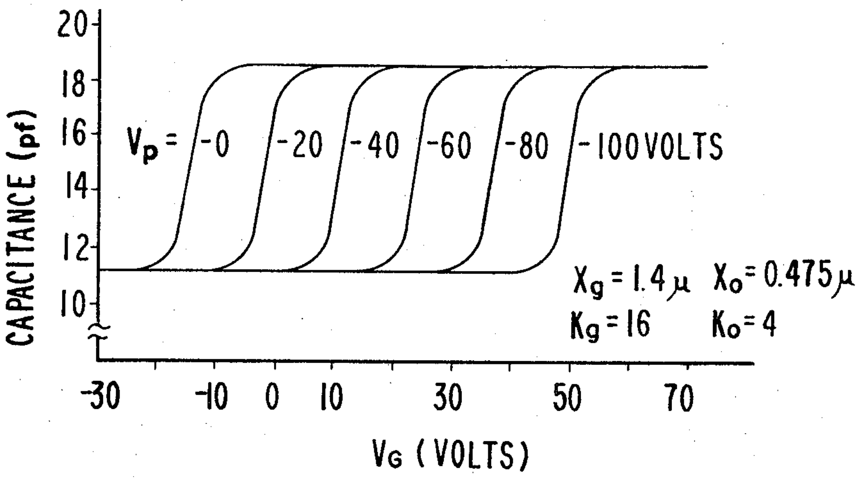
FIG. 2 is a family of curves indicating the shift in the capacitance-voltage characteristic of the capacitor of FIG. 1 with different applied polarizing voltages.

FIG. 2 shows a family of curves indicating the shift of the voltage characteristic for various applied voltages to a MOS capacitor such as shown in FIG. 1. In each case, the voltage was applied at 200° centigrade for five minutes. As is obvious by the curves, the application of a more negative voltage produced a shift in the positive direction for the threshold value of the device.

Figure 3:
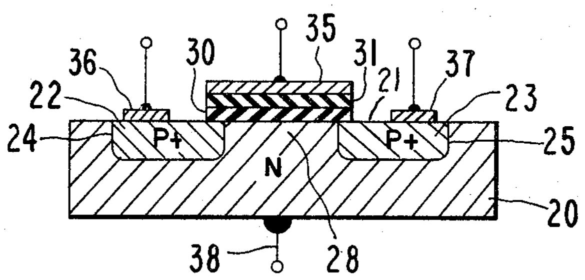
FIG. 3 is a cross sectional elevation view of a MOS transistor according to the invention; and, FIG. 4 is a family of curves illustrating the change in the current versus gate voltage characteristic of the transistor of FIG. 3 with several different applied polarizing voltages.

Referring now to FIG. 3, there is shown a MOS transistor according to the invention, which, with the exception of the two layer dielectric, functions in a manner similar to the device of the above mentioned Kahng patent. As shown in the figure, the device comprises a substrate or wafer 20 of a preferably monocrystalline semiconductor material, such as silicon, which is of a first conductivity type (N-type as shown). Located within the wafer 20 adjacent a major surface 21 thereof are first and second spaced regions 22 and 23 of opposite conductivity type (P-type). The regions 22 and 23, which are preferably formed by well-known photoresist and diffusion techniques, form respective planar P-N junctions 24 and 25 with the wafer 20 extending to the major surface 21. The portion 28 of the wafer 20 between the regions 22 and 23 is referred to as the channel region of the MOST device.

Formed on the surface 21 overlying the channel region 28 and extending over the adjacent portions of the junctions 24 and 25 is a layer 30 of a nonferroelectric insulating dielectric material, preferably silicon dioxide in the case of a silicon semiconductor material. Although not shown, as is conventional, the remainder of the surface 21 (except for openings for the connection of ohmic contacts to regions 22 and 23) may also be covered with the same dielectric insulating material as that used over the channel region.

As with the capacitor of FIG. 1, a layer 31 of nonferroelectric insulating dielectric material having a higher thermally activated conductivity than the material of layer 30 is formed over the portion of the layer 30 covering the channel region 28. A metal electrode 35 is deposited or formed on the exposed surface of the dielectric layer 31 for the purpose of applying an electric field to the channel region 28 and to the adjacent portions of the P-N junctions 24 and 25. Metallized ohmic electrical contacts 36, 37, and 38 are provided for the substrate 20 and the regions 22 and 23, respectively. The control gate 35 and the metallized contacts 36 and 38 may be formed by well-known techniques in the semiconductor art, for example, as disclosed in U.S. Patent 3,108,359 issued Oct. 29, 1963 to G. E. Moore and R. N. Noyce. It should be noted that the structure as shown and described in FIG. 3 is an enchancement of a normally nonconductive MOST. However, it is obvious to one skilled in the art that a thin monocrystalline semiconductor layer having the same conductivity type as the regions 22 and 23 may be provided at the surface of the channel region 28 to connect the regions 22 and 23. This thin layer may be readily produced by such means as epitaxial growth or well-known diffusion techniques and may be regarded as part of the wafer or body 20. Such a layer provides a conductive path between the regions 22 and 23 in the absence of an applied potential to the gate electrode 35, hence resulting in a normally conducting or depletion mode MOST.

Figure 4:
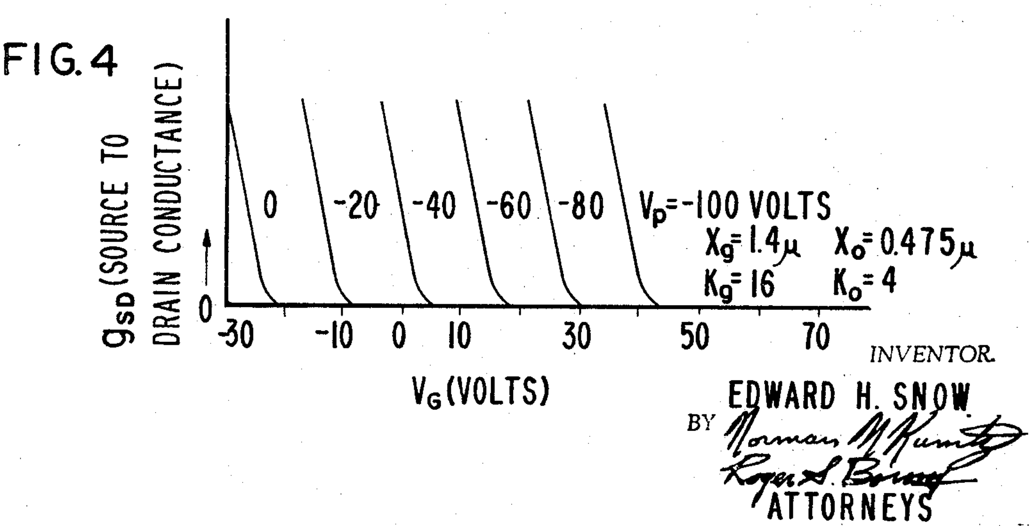

The device of FIG. 3 operates generally in the normal manner of MOST devices. That is, the application of a potential to the gate electrode 35 will cause an inversion of the surface layer of the channel region 28 and the forming of a conductive path between the regions 22 and 23. However, because of the particular dielectric arrangement in the gate region, the voltage at which the inversion begins to take place (the threshold voltage) may be adjusted to a predetermined value by establishing a desired space charge at the interface of the dielectric layers 30 and 31. This space charge may be established in a manner similar to that described with respect to the capacitor of FIG. 1, i.e., by raising the temperature of the device to a relatively high temperature, applying a potential across the electrodes 35 and 38 for a relatively short period of time, followed by cooling and immobilization of the ions and the subsequent removal of the polarizing potential. The effect of the desired space charge polarization at the interface of the dielectric layers 30 and 31 is to shift the current voltage characteristic of the MOST along the voltage axis in the same manner as the capacitance-voltage characteristic of the MOS capacitor is shifted, i.e., according to the above mentioned equation. FIG. 4 shows a graph of current shift in the MOST for different polarizing potentials applied for like periods of time at the same elevated temperatures.

Although as indicated above the heating of the device in order to establish the desired space charge polarization is accomplished by means of a heater or oven, it is to be understood that it is often desirable to change the value of the space charge polarization and hence the threshold voltage after the device has already been incorporated into a circuit, in which case the placing of the circuit in an oven might not be practical. Accordingly, it is to be understood that ovens are not necessary for the heating operation but that electrical heating may be incorporated into the MOS device by any of a number of well-known techniques. For example, a Nichrome resistor may be placed on the MOS wafer chip, or additional contacts may be used to produce an MOS resistor in the substrate. It is also possible to heat the device by forward biasing or reverse biasing into avalanche the P-N junctions 24 and 25 or other nearby junctions.

Obviously, other modifications of the invention are possible in light of the above teachings without departing from the spirit of the invention. Accordingly, the invention is to be limited only by the scope of the appended claims.

What is claimed is:

1. A variable threshold semiconductor device comprising:

a body of semiconductor material of a first conductivity type;

means for making ohmic contact to said body;

a first layer of a first nonferroelectric dielectric material on one surface of said body;

a second layer of a second nonferroelectric dielectric material having a higher thermally activated conductivity than said first dielectric material formed on the exposed surface of said first layer; and, a metal electrode overlying the exposed surface of said second layer.

2. The device of claim 1 having a predetermined interfacial polarization between said two dielectric layers.

3. The device of claim 1 wherein said second layer is a glass.

4. The semiconductor device of claim 1 including first and second spaced regions of opposite conductivity type in said body and forming respective first and second spaced P-N junctions, which define the ends of a channel region, said first layer of dielectric material overlying said channel region, and means for making ohmic electrical contact to said first and second regions.

5. A variable threshold field effect transistor comprising:

a semiconductor body of a first conductivity type;

first and second regions of opposite conductivity type formed within said body and forming respective first and second P-N junctions which extend to a major surface of said body, said first and second regions being spaced apart to define the ends of a channel region;

a first layer of a first nonferroelectric dielectric material overlying at least said channel region and the adjacent portions of the respective P-N junctions;

means for making ohmic electrical contact to said first and second regions and to said body;

a second layer of a second nonferroelectric dielectric material having a higher thermally activated conductivity than said first material formed on the exposed surface of said first layer overlying said channel region and the adjacent portions of the respective P-N junctions; and, an electrode overlying said second layer for applying an electrical field to said channel region and the adjacent portions of the respective P-N junctions.

6. The transistor of claim 5 having a predetermined interfacial polarization between said two dielectric layers.

7. The transistor of claim 5 wherein said semiconductor material is silicon and wherein said first dielectric material is a silicon oxide.

8. The transistor of claim 7 wherein said second dielectric material is a glass.

9. The transistor of claim 7 wherein said second dielectric material is a lead borosilicate glass.

10. A variable threshold semiconductor device comprising:

a body of semiconductor material of a first conductivity type;

means for making ohmic contact to said body;

a first layer of a first nonferroelectric dielectric material on one surface of said body;

a second layer of a second nonferroelectric dielectric material having a higher thermally activated conductivity than said first dielectric material formed on the exposed surface of said first layer, said second dielectric material containing a substantially permanent first space charge region of a selected polarity adjacent the interface of said second dielectric material with said first dielectric material, and a substantially permanent second space charge region of opposite polarity on the opposite face of said second dielectric material; and, a metal electrode overlying the exposed surface of said second layer.

References Cited

UNITED STATES PATENTS

| | | | |
|---|---|---|---|
| 3,328,210 | 6/1967 | McCaldin et al. | 317—235 |
| 3,343,049 | 9/1967 | Miller et al. | 317—235 |

OTHER REFERENCES

IBM Tech Disclosure Bulletin, "Pb-$SiO_2$ Composite Layer and Method of Forming," by Esch et al., vol. 8, No. 11, April 1966, p. 1641.

IBM Journal of Research and Development, "Effect of Temperature and Bias on Glass-Silicon Interfaces," by Kerr, vol. 8, No. 4, September 1964, pp. 385–393.

JOHN W. HUCKERT, *Primary Examiner.*

JERRY D. CRAIG, *Assistant Examiner.*